United States Patent
Chen et al.

(10) Patent No.: US 7,960,792 B2
(45) Date of Patent: Jun. 14, 2011

(54) NON-VOLATILE MEMORY WITH A STABLE THRESHOLD VOLTAGE ON SOI SUBSTRATE

(75) Inventors: Hsin-Ming Chen, Tainan County (TW); Hai-Ming Lee, Taipei (TW); Shih-Jye Shen, Hsinchu (TW); Ching-Hsiang Hsu, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 12/943,945

(22) Filed: Nov. 11, 2010

(65) Prior Publication Data

US 2011/0057243 A1    Mar. 10, 2011

Related U.S. Application Data

(62) Division of application No. 11/833,235, filed on Aug. 3, 2007, now Pat. No. 7,855,417.

(60) Provisional application No. 60/821,576, filed on Aug. 7, 2006.

(51) Int. Cl.
*H01L 29/786* (2006.01)
*H01L 29/792* (2006.01)

(52) U.S. Cl. .......... 257/349; 257/324; 257/348; 257/66; 257/402; 257/E29.273; 257/E29.309

(58) Field of Classification Search .................... 257/66, 257/324, 348–349, 376, 402, E29.273, E29.309
See application file for complete search history.

(56) References Cited

U.S. PATENT DOCUMENTS

| | | | | |
|---|---|---|---|---|
| 6,154,091 A * | 11/2000 | Pennings et al. | ............... | 327/565 |
| 6,180,984 B1 * | 1/2001 | Golke et al. | ................... | 257/347 |
| 7,126,170 B2 * | 10/2006 | Inoue et al. | ................... | 257/194 |
| 7,432,552 B2 * | 10/2008 | Park et al. | ..................... | 257/349 |
| 7,764,540 B2 * | 7/2010 | Morishita et al. | .............. | 365/180 |

* cited by examiner

*Primary Examiner* — Anh Phung
*Assistant Examiner* — Allison P Bernstein
(74) *Attorney, Agent, or Firm* — Jianq Chyun IP Office

(57) ABSTRACT

A non-volatile memory disposed in a SOI substrate is provided. The non-volatile memory includes a memory cell and a first conductive type doped region. The memory cell includes a gate, a charge storage structure, a bottom dielectric layer, a second conductive type drain region, and a second conductive type source region. The gate is disposed on the SOI substrate. The charge storage structure is disposed between the gate and the SOI substrate. The bottom dielectric layer is disposed between the charge storage layer and the SOI substrate. The second conductive type drain region and the second conductive type source region are disposed in a first conductive type silicon body layer next to the two sides of the gate. The first conductive type doped region is disposed in the first conductive type silicon body layer and electrically connected to the first conductive type silicon body layer beneath the gate.

9 Claims, 13 Drawing Sheets

NON-VOLATILE MEMORY WITH A STABLE THRESHOLD VOLTAGE ON SOI SUBSTRATE

CROSS-REFERENCE TO RELATED APPLICATION

This application is a divisional application of and claims priority benefit of an application Ser. No. 11/833,235, filed on Aug. 3, 2007, which claims the priority benefit of U.S. provisional application Ser. No. 60/821,576, filed on Aug. 7, 2006. The entirety of each of the above-mentioned patent applications is hereby incorporated by reference herein and made a part of this specification.

BACKGROUND OF THE INVENTION

1. Field of the Invention

The present invention generally relates to a semiconductor device, and particularly, to a non-volatile memory and an operating method thereof.

2. Description of Related Art

Currently, silicon on insulation (SOI) structures are often used as substrates of semiconductor devices. An SOI structure typically contains an insulation layer, e.g., a silicon dioxide layer, disposed adjacent to a surface of the silicon substrate material so as to isolate a silicon body layer for fabricating semiconductor devices from a silicon substrate, and in this manner it is named as silicon on insulation. In such an SOI structure, because an area in which the semiconductor device is configured is isolated from the silicon substrate, paths of transistors in an active area causing latching up, e.g., connection between source and substrate, well and substrate, are eliminated by the insertion of the insulation layer therebetween, thus avoiding latching up problems therebetween.

This SOI technique for fabricating IC has the advantages such as: electrically, it prevents a problem of congenital interface capacitance parasitism of device of a bulk silicon wafer; and it not only effectively depresses latching up problems caused by parasitic bipolar effect of the semiconductor device, but also improves immunity of the semiconductor device to soft errors caused by α Particles.

Non-volatile memory devices, having the advantage of storing data therein which would not be lost when power supply is turned off, become widely adopted by person computers and electronic equipments.

A typical non-volatile memory device uses a doped polysilicon for fabricating a floating gate and a control gate, which also constitute a stack structure. There is an insulation layer disposed between the floating gate and the substrate, and between the floating gate and the control gate, respectively.

U.S. Pat. No. 6,115,287 discloses a non-volatile memory device fabricated on an SOI substrate. However, with respect to such a memory device, electrons generated in an impact ionization process will accumulate at a bottom of the silicon body layer. Therefore, the potential at the silicon body layer gradually shifting from original designated value so that the threshold voltage of the memory cell is caused to have variations, which affects the programming operation.

SUMMARY OF THE INVENTION

Accordingly, the present invention is directed to provide a non-volatile memory and an operating method thereof. The non-volatile memory is configured on an SOI substrate, in which an threshold voltage of a memory cell thereof can be maintained during operation by configuring a additional doped region, i.e., a well pickup region, which is electrically connected to a silicon body layer beneath the gate of the memory cell and/or a silicon body layer beneath a gate of a selecting transistor, thus improving an operation efficiency thereof.

The present invention further provides a non-volatile memory disposed on a silicon on insulation (SOI) substrate. The SOI substrate includes a first conductive type silicon body layer configured thereon. The non-volatile memory includes a memory cell and a first conductive type doped region. The memory cell is disposed on the SOI substrate. The memory cell includes a gate, a charge storage structure, a bottom dielectric layer, a second conductive type drain region and a second conductive type source region. The gate is disposed on the SOI substrate. The charge storage structure is disposed between the gate and the SOI substrate. The bottom dielectric layer is disposed between the charge storage structure and the SOI substrate. The second conductive type drain region and the second conductive type source region are disposed in a first conductive type silicon body layer respectively distributed at two sides of the gate. The first conductive type doped region is disposed in the first conductive type silicon body layer and is electrically connected to the first conductive type silicon body layer beneath the gate.

According to an embodiment of the present invention, the foregoing gate structure includes a first portion and a second portion. The second portion is disposed at an end of the first portion, and the second portion is substantially perpendicular and connecting with the first portion. The second conductive type drain region and the second conductive type source region are disposed in the first conductive type silicon body layer that is distributed at two sides of the first portion. The first conductive type doped region is disposed in and connecting to the first conductive type silicon body layer at one side of the second portion, and is interspaced by the second portion to be opposite to the second conductive type drain region and the second conductive type source region.

According to an embodiment of the present invention of the non-volatile memory, the foregoing first conductive type doped region is disposed at one side of the gate and neighbours on the second conductive type source region.

According to an embodiment of the present invention of the non-volatile memory further includes a top dielectric layer. The top dialectic layer is disposed between the charge storage structure and the gate.

According to an embodiment of the present invention of the non-volatile memory, the foregoing memory cell is a full depletion memory cell or a partial depletion memory cell.

According to an embodiment of the present invention of the non-volatile memory, the foregoing charge storage structure is made of silicon nitride or nanocrystal.

In the non-volatile memory according to the present invention, because of the configuration of the first conductive type doped region, i.e., the well pickup region, the first conductive type doped region is electrically connected to the first conductive type silicon body layer beneath the gate. As such, in operating the memory cell, a voltage can be applied to the first conductive type silicon body layer beneath the gate, so as to avoid the voltage of the first conductive type silicon body layer from deviating from a predetermined value due to accumulation of hot carriers in the silicon body layer. In such a way, the threshold voltage of the memory cell can be maintained and thus improving the operation efficiency thereof.

The present invention provides a non-volatile memory disposed on an SOI substrate. The SOI substrate includes a first conductive type silicon body layer. The non-volatile memory includes a memory cell and a selecting transistor. The memory cell is disposed on the SOI substrate. The memory cell includes a first gate, a charge storage structure, a bottom dielectric layer, a second conductive type first source/drain region, and a second conductive type second source/drain region. The first gate is disposed on the SOI substrate. The charge storage structure is disposed between the first gate and the SOI substrate. The bottom dielectric layer is disposed between the charge storage structure and the SOI substrate. The second conductive type first source/drain region and the second conductive type second source/rain region are disposed in a first conductive type silicon body layer respectively at two sides of the first gate. The selecting transistor is disposed on the SOI substrate. The selecting transistor includes a second gate, a gate dielectric layer, a second conductive type second source/drain region and a second conductive type third source/drain region. The second gate is disposed on the SOI substrate. The gate dielectric layer is disposed between the second gate and the SOI substrate. The second conductive type second source/drain region and the second conductive type third source/drain region are disposed in the first conductive type silicon body layer respectively at two sides of the second gate. The second conductive type second source/drain region is in common used by the selecting transistor and the memory cell.

According to an embodiment of the present invention of the non-volatile memory, further includes a first conductive type first doped region. The first conductive type first doped region is disposed in the first conductive type silicon body layer, and is electrically connected to the first conductive type silicon body layer beneath the first gate.

According to an embodiment of the present invention of the non-volatile memory, the foregoing first gate includes a first portion and a second portion. The second portion is disposed at an end of the first portion, and the second portion is substantially perpendicular and connecting with the first portion. The second conductive type first source/drain region and the second conductive type second source/drain region are disposed in the first conductive type silicon body layer at two sides of the first portion. The first conductive type doped region is disposed in the first conductive type silicon body layer at one side of the second portion, and is interspaced by the second portion to be opposite to the second conductive type first source/drain region and the second conductive type second source/drain region.

According to an embodiment of the present invention of the non-volatile memory, the foregoing first conductive type doped region is disposed at one side of the first gate and neighbours on the second conductive type second source/drain region.

According to an embodiment of the present invention of the non-volatile memory, further includes a first plug, electrically coupled to the first conductive type first doped region.

According to an embodiment of the present invention of the non-volatile memory, further includes a first conductive type second doped region disposed in the first conductive type silicon body layer and electrically connected to the first conductive type silicon body layer beneath the second gate.

According to an embodiment of the present invention of the non-volatile memory, the foregoing first conductive type second doped region is disposed at one side of the second gate, and neighbours on the second type third source/drain region.

According to an embodiment of the present invention of the non-volatile memory, further includes a second plug electrically connected to the first conductive type second doped region.

According to an embodiment of the present invention of the non-volatile memory, further includes a tope dielectric layer. The tope dielectric layer is disposed between the charge storage structure and the gate.

According to an embodiment of the present invention of the non-volatile memory, the foregoing charge storage structure is made of silicon nitride or nanocrystal.

In the non-volatile memory according to the present invention, because of the configuration of the first conductive type first doped region and/or the first conductive type second doped region, the first conductive type first doped region and/or the first conductive type second doped region are electrically connected to the first conductive type silicon body layer beneath the first gate and/or the second gate respectively. As such, in operating the memory cell, a voltage can be applied to the first conductive type silicon body layer beneath the first gate and/or the second gate, so as to avoid the voltage of the first conductive type silicon body layer from deviating from a predetermined value due to accumulation of hot carriers in the silicon body layer. In such a way, the threshold voltage of the memory cell can be maintained and thus improving the operation efficiency thereof.

The present invention further provides an operating method of a non-volatile memory adapted for a non-volatile memory disposed on an SOI substrate including a first conductive type silicon body layer. The non-volatile memory includes a gate, a charge storage structure, a second conductive type drain region, and a second conductive type source region. In operating such a non-volatile memory, voltages are applied to the gate, the second conductive type drain region, the second conductive type source region and the first conductive type silicon body layer beneath the gate, to inject electrons or holes in to the charge storage structure or evacuate the electrons from the charge storage structure by a method selected from a group consisting of channel hot carrier injection, source side injection, band-to-band tunnelling hot carrier injection and Fowler-Nordheim (F-N) tunnelling.

According to an embodiment of the present invention of the foregoing method, the foregoing first conductive type is P type, and the foregoing second conductive type is N type. According to an embodiment of the present invention, the operating method further includes: applying a first voltage to the gate; applying a second voltage to the second conductive type drain region, applying a third voltage to the second conductive type source region, and applying a fourth voltage to the first conductive type silicon body layer beneath the gate to inject electrons into the charge storage structure by channel hot electron injection, in which the second voltage is greater than the third voltage, and the first voltage is greater than the fourth voltage.

According to an embodiment of the present invention of the method, the foregoing first conductive type is P type; the second conductive type is N type. According to an embodiment of the invention, the operating method further includes: applying a fifth voltage to the gate, applying a sixth voltage to the second conductive type drain region, applying a seventh voltage to the second conductive type source region, and applying an eighth voltage to the first conductive type silicon body layer beneath the gate to inject holes into the charge storage structure with a band-to-band tunnelling hot hole injection, in which the sixth voltage is greater than the fifth voltage, and the eighth voltage is greater than the fifth voltage.

According to an embodiment of the present invention of the method, the foregoing first conductive type is P type; the second conductive type is N type. According to an embodiment of the invention, the operating method further includes: applying a ninth voltage to the gate, and applying a tenth voltage to the first conductive type silicon body layer beneath the gate to inject electrons into the charge storage structure by an F-N tunnelling, in which a voltage difference between the ninth voltage and the tenth voltage is great enough to trigger the F-N tunnelling to occur there between.

According to an embodiment of the present invention of the method, the foregoing first conductive type is P type; the second conductive type is N type. According to an embodiment of the invention, the operating method further includes: applying an eleventh voltage to the gate and applying a twelfth voltage to the first conductive type silicon body layer beneath the gate to evacuate electrons from the charge storage structure by F-N tunnelling, in which the twelfth voltage is greater than the eleventh voltage.

According to an embodiment of the present invention of the method, the foregoing first conductive type is N type, and the second conductive type is P type. According to an embodiment of the present invention, the operating method further includes: applying a thirteenth voltage to the gate, applying a fourteenth voltage to the second conductive type drain region, applying a fifteenth voltage to the second conductive type source region, and applying a sixteenth voltage to the first conductive type silicon body layer beneath the gate to inject electrons into the charge storage structure by channel hot electron injection, in which the fifteenth voltage is greater than the fourteenth voltage, and the sixteenth voltage is greater than the thirteenth voltage.

According to an embodiment of the present invention of the method, the foregoing first conductive type is N type, and the second conductive type is P type. According to an embodiment of the present invention, the operating method further includes: applying a seventeenth voltage to the gate, applying an eighteenth voltage to the second conductive type drain region, applying a nineteenth voltage to the second conductive type source region, and applying a twentieth voltage to the first conductive type silicon body layer beneath the gate to inject electrons into the charge storage structure by band-to-band tunnelling hot electron injection, in which the seventeenth voltage is greater than the eighteenth voltage, and the seventeenth voltage is greater than the twentieth voltage.

According to an embodiment of the present invention of the method, the foregoing first conductive type is N type; the second conductive type is P type. According to an embodiment of the present invention, the operating method further includes: applying a twenty-first voltage to the gate, and applying a twenty-second voltage to the first conductive type silicon body layer beneath the gate to evacuate electrons from the charge storage structure by an F-N tunnelling, in which a voltage difference between the twenty-second voltage and the twenty-second voltage is greater enough to trigger the F-N tunnelling to occur there between.

The present invention provides an operating method for a non-volatile memory disposed on an SOI substrate having a first conductive type silicon body layer. The non-volatile memory includes a memory cell and a selecting transistor serially connected thereto. The memory cell includes a first gate, a charge storage structure, a first source/drain region, and a second source/drain region. The selecting transistor includes a second gate, a second source/drain region and a third source/drain region. The selecting transistor and the memory cell share the second source/drain region in common. The operating method further includes: in programming the memory cell, applying a first voltage to the first gate, applying a second voltage to the second gate, applying a third voltage to the first source/drain region, applying a fourth voltage to the third source/drain region, and applying a fifth voltage to the silicon body layer beneath the first gate to inject electrons into the charge storage structure by band-to-band tunnelling hot electron injection, in which the second voltage is enough for turning off the channel of the selecting transistor; the first voltage is greater than the fifth voltage, the first voltage is greater than the third voltage.

According to an embodiment of the present invention, the operating method further includes: applying a sixth voltage to the first gate, applying a seventh voltage to the second gate, applying an eighth voltage to the first source/drain region, applying a ninth voltage to the third source/drain region, and applying a tenth voltage to the silicon body layer beneath the first gate to inject electrons into the charge storage structure with a channel hot electron injection, in which the seventh voltage is enough for turning on the channel of the selecting transistor; the sixth, eighth and ninth voltages are optimised to trigger the channel hot carrier injections.

According to an embodiment of the present invention, the operating method further includes: in erasing the memory cell, applying an eleventh voltage to the first gate, applying a twelfth voltage to the second gate, applying a thirteenth voltage to the first source/drain region, applying a fourteenth voltage to the third source/drain region, applying a fifteenth voltage to the silicon body layer beneath the first gate, in which the twelfth voltage is set for turning on the channel of the selecting transistor; and a voltage difference between the eleventh voltage and the fifteenth voltage is enough for triggering the F-N tunnelling.

According to the operating method for the non-volatile memory of the present invention, one selected from the group consisting of channel hot carrier injection, hot carrier injection triggered by a valence-conduction band tunnelling system, and F-N tunnelling effect is employed for inject electrons or holes into the charge storage structure, or evacuating electrons or holes from the charge storage structure, so as to program or erase the memory cell.

Furthermore, there is disposed a doped region, i.e., well pickup region, in the memory cell. A conductive type of the doped region is identical with that of the silicon body layer beneath the gate of the memory cell and/or the gate of the selecting transistor. As such, in operating the non-volatile memory, voltages are applied to the silicon body layer beneath the gate of the memory cell and/or the gate of the selecting transistor, so as to avoid the voltage of the first conductive type silicon body layer from deviating from a predetermined value due to accumulation of hot carriers in the silicon body layer. In such a way, the threshold voltage of the memory cell can be maintained and thus improving the operation efficiency thereof.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
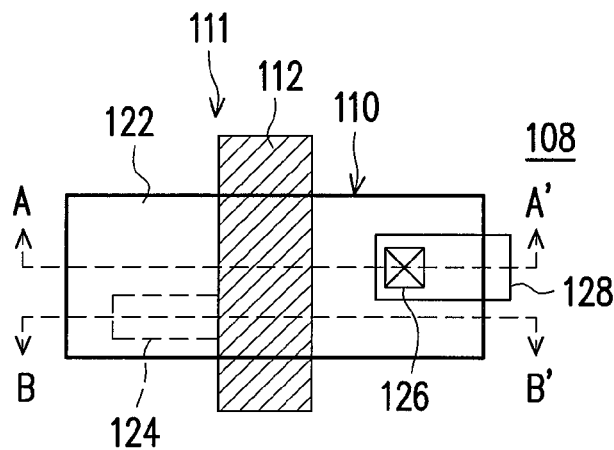
FIG. 1A is a top view of a non-volatile memory according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
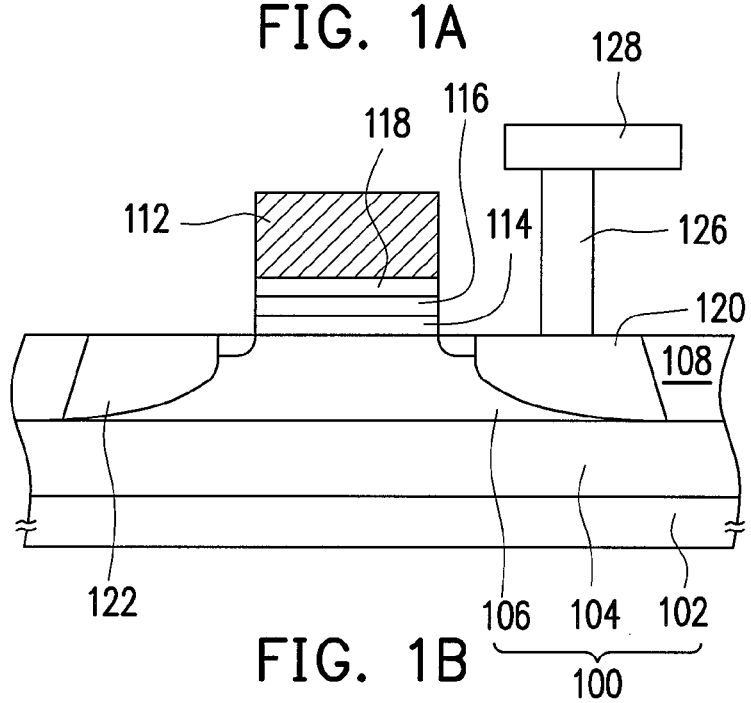
FIG. 1B is a cross-sectional view of FIG. 1A along line A-A'.
Figure 1C:
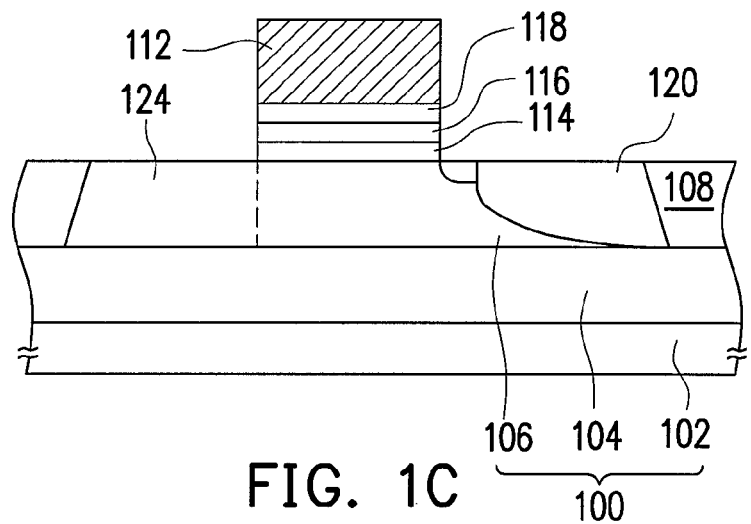
FIG. 1C is a cross-sectional view of FIG. 1A along line B-B'.

FIG. 1A is a top view of a non-volatile memory according to an embodiment of the present invention. FIG. 1B is a cross-sectional view of FIG. 1A along line A-A'. FIG. 1C is a cross-sectional view of FIG. 1A along line B-B'.

Referring to FIGS. 1A to 1C, the non-volatile memory according to the embodiment of the present invention is configured on a silicon on insulation (SOI) substrate 100. The SOI substrate 100 for example includes a substrate material layer 102, a dielectric layer 104, and a first conductive type silicon body layer 106. The dielectric layer 104 for example is a layer of oxide.

In the first conductive type silicon body layer 106, there is disposed an isolation structure 108 for defining a device active area 110. The isolation structure 108 for example is a shallow trench isolation (STI) structure. The STI structure for example is made of silicon oxide. As an alternative option, the isolation structure 108 can also be a field oxidation layer.

The memory cell 111 for example is disposed on the SOI substrate 100. The memory cell 111 for example includes a gate 112, a bottom dielectric layer 114, a charge storage structure 116, a top dielectric layer 118, a second conductive type drain region 120, and a second conductive type source region 122, and a first conductive type doped region 124.

The gate 112 for example is disposed on the SOI substrate 100. The gate 112 for example is made of doped polysilicon.

The charge storage structure 116 for example is disposed between the gate 112 and the SOI substrate 100. The charge storage structure 116 for example can be made of silicon nitride or nanocrystal. However, the charge storage structure 116 is not limited to be made of silicon nitride or nanocrystal. It can also be made of other materials, such as silicon oxynitride, tantalum oxide, strontium titanate, hafnium oxide, etc.

The bottom dielectric layer 114 for example is disposed between the charge storage structure 116 and the SOI substrate 100. The bottom dielectric layer 114 for example is made of silicon oxide.

The top dielectric layer 118 for example is disposed between the charge storage structure 116 and the gate 112. The top dielectric layer 118 for example is made of silicon oxide or other dielectric material having a high dielectric constant.

The second conductive type drain region 120 and the second conductive type source region 122 for example are distributed in the first conductive type silicon body layer 106 and at two sides of the gate 112.

The first conductive type doped region 124 for example is disposed in the first conductive type silicon body layer 106, and is electrically connected to the first conductive type silicon body layer beneath the gate 112. According to an aspect of the embodiment, the first conductive type dope region 124 for example is disposed at one side of the gate 112, and neighbours on the second conductive type source region 122.

Further, there are a plug 126 and a conductive line 128 disposed on the second conductive type drain region 120. The conductive line 128 is electrically connected to the second conductive type drain region 120 via the plug 126. The plug 126 and the conductive line 128 are made of metallic materials, or doped polysilicon.

In the foregoing embodiments, if the first conductive type is P type, and the second conductive type is N type, then the memory cell 111 is an N type channel memory cell; and if the first conductive type is N type, and the second conductive type is P type, then the memory cell 111 is a P type channel memory cell. According to an aspect of the invention, the memory cell is a full depletion memory cell or a partial depletion memory cell.

In the memory cell 111 of the present invention, because of the disposition of the first conductive type doped region 124, i.e., the well pickup region, electrically coupled to the first conductive type silicon body layer 106 beneath the gate 112, when operating the memory cell 111, a voltage can be applied (individually applied for example) to the first conductive type silicon body layer 106 beneath the gate 112. Or otherwise, the second conductive type source region 122 and the first conductive type doped region 124 are conformed into a salicide for electrical connection there between. When hot carriers are generated, the hot carriers pass the silicide conformed by the first conductive type doped region 124 and the second conductive type source region 122, and evacuated from the second conductive type source region 122. In such a way, a voltage of the first conductive type silicon body layer 106 is prevented from deviating from an originally determined value thereof due to the accumulation of the hot carriers in the silicon body layer 106. In such a way, the threshold voltage of the memory cell can be maintained and thus improving the operation efficiency thereof.

Figure 2A:
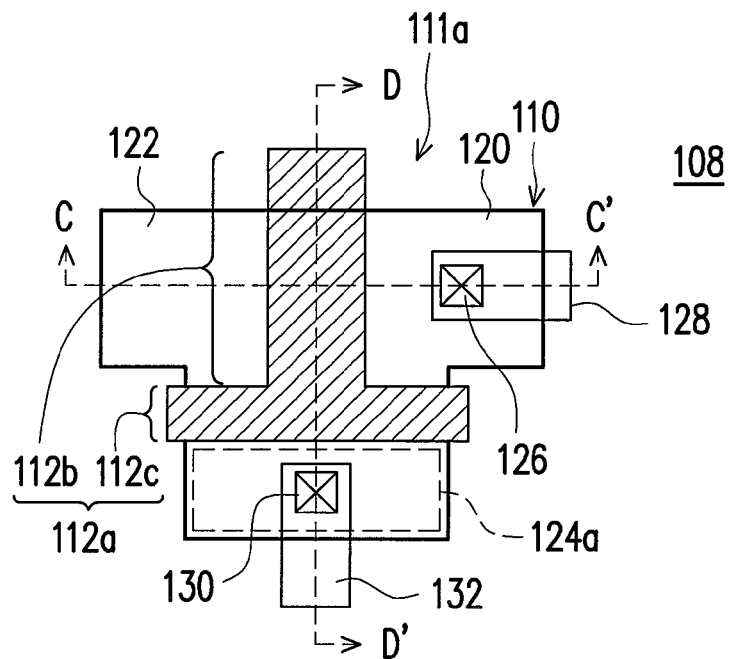
FIG. 2A is a top view of a non-volatile memory according to an embodiment of the present invention.
Figure 2B:
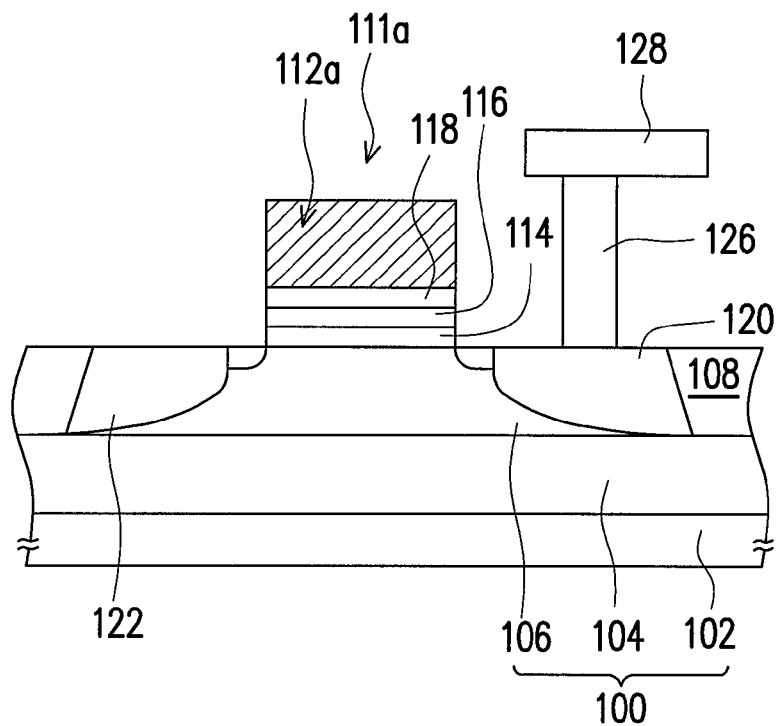
FIG. 2B is a cross-sectional view of FIG. 2A along line C-C'.
Figure 2C:
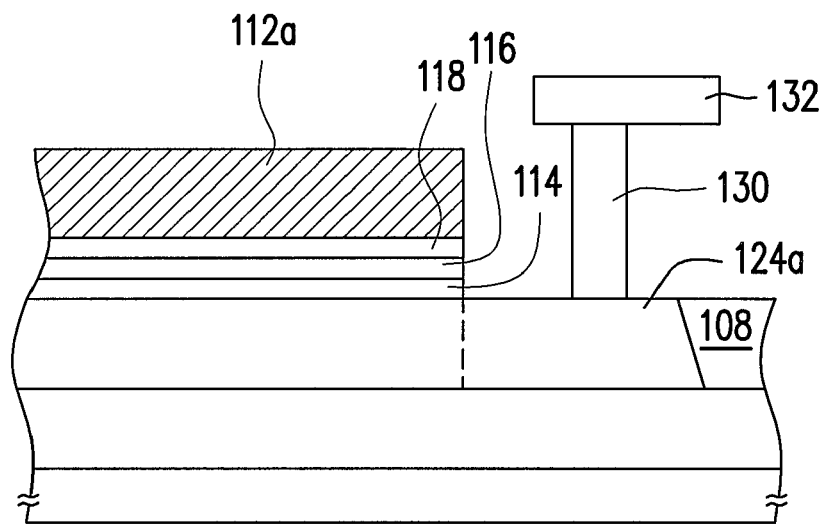
FIG. 2C is a cross-sectional view of FIG. 2A along line D-D'.
Figure 3:
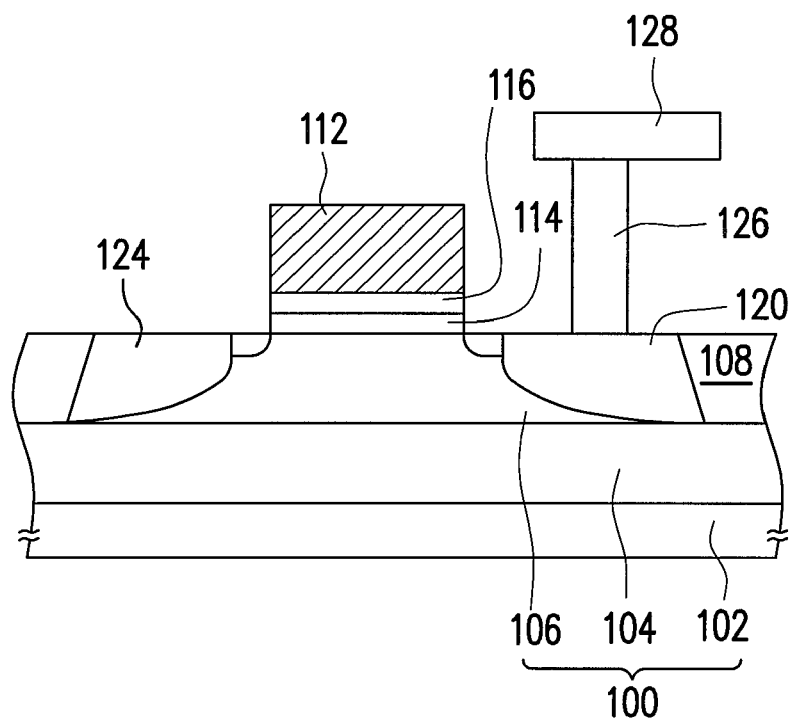
FIG. 3 is a structural cross-sectional view of the non-volatile memory according to an embodiment of the present invention.

FIG. 2A is a top view of a non-volatile memory according to an embodiment of the present invention. FIG. 2B is a cross-sectional view of FIG. 2A along line C-C'. FIG. 2C is a cross-sectional view of FIG. 2A along line D-D'. FIG. 3 is a structural cross-sectional view of the non-volatile memory according to an embodiment of the present invention. In FIGS. 2A to 2C, and 3, same elements are marked with same numbers, and description thereto is not iterated while only difference there between is to be discussed below.

Referring to FIGS. 2A to 2C, the gate 112a of the memory cell 111a includes a first portion 112b and a second portion 112c. The second portion 112c for example is disposed at an end of the first portion 112b. The first portion 112b is substantially perpendicular and connecting with the second portion 112c. Accordingly, as shown in FIG. 2A, the gate 112a is configured with a T shape.

The second conductive type drain region 120 and the second conductive type source region 122 are disposed in for example the first conductive type silicon body layer 106 and at two sides of the first portion 112b.

The first conductive type doped region 124a for example is disposed in the first conductive type silicon body layer 106 and at one side of the second portion 112c, and interspaced by the second portion 112c to be opposite to the second conductive type drain region 120 and the second conductive type source region 122.

Further, there are disposed a plug 130 and a conductive line 132 on the first conductive type doped region 124a. The conductive line 132 electrically connects the first conductive type doped region 124a via the plug 130. The plug 130 and the conductive line 132 are made of for example metallic materials or doped polysilicon.

Similarly, in the memory cell, because of the disposition of the first conductive type doped region 124, i.e., the well pickup region, electrically coupled to the first conductive type silicon body layer 106 beneath the gate 112a, when operating the memory cell 111, a voltage can be applied to the first conductive type silicon body layer 106 beneath the gate 112. In such a way, a voltage of the first conductive type silicon body layer 106 is prevented from deviating from an originally determined value thereof due to the accumulation of the hot carriers in the silicon body layer 106. In such a way, an threshold voltage of the memory cell can be maintained and thus improving the operation efficiency thereof. Moreover, the first conductive type doped region 124a can be individually applied with a voltage, so as to allow more complicated operation, such as erasing operation.

Further, in the memory cell as shown in FIG. 1B, the disposition of the top dielectric layer 118 is not a must. As shown in FIG. 3, the gate 112 directly contacts the charge storage structure 116. Similarly, the top dielectric layer 118 can also be neglected from the memory cell of FIG. 2B.

Figure 4A:
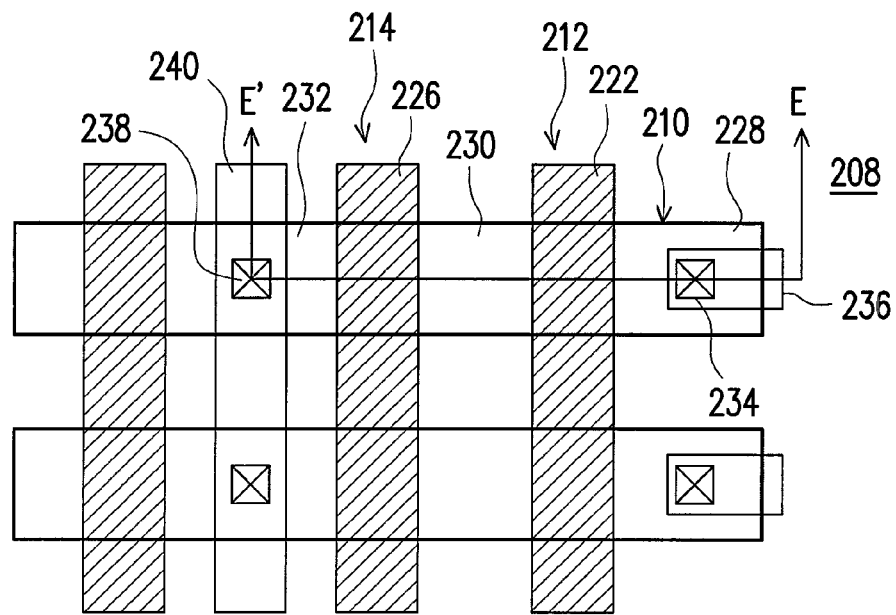
FIG. 4A is a top view of a non-volatile memory according to an embodiment of the present invention.
Figure 4B:
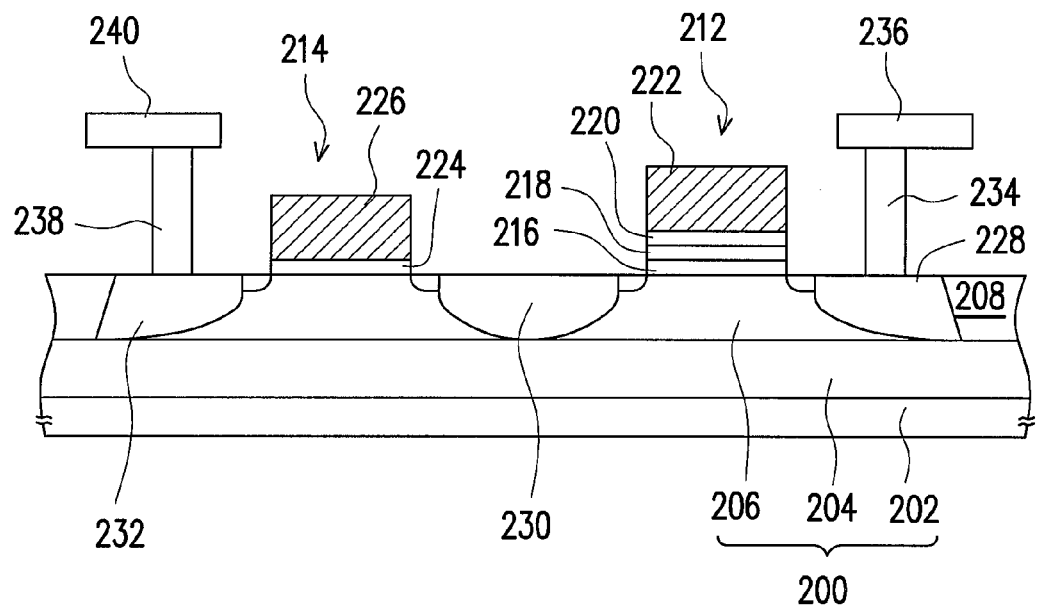
FIG. 4B is a cross-sectional view of FIG. 4A along line E-E'.
Figure 4C:
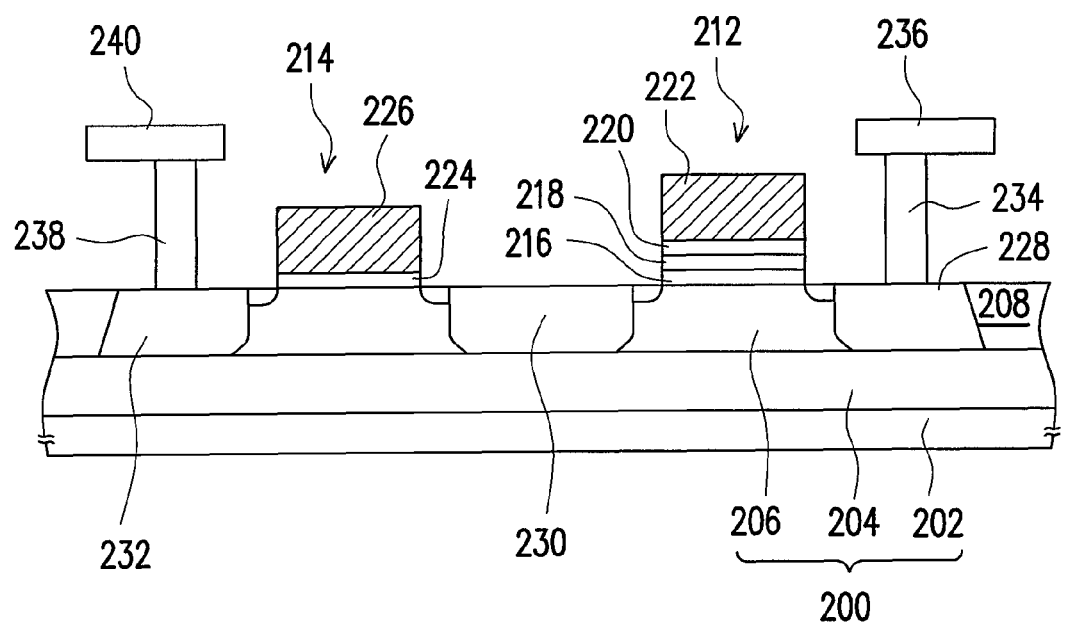
FIG. 4C is a cross-sectional view of FIG. 4A along line E-E'.

FIG. 4A is a top view of a non-volatile memory according to another embodiment of the present invention. FIGS. 4B and 4C are cross-sectional views of FIG. 4A along line E-E'.

Referring to FIGS. 4A and 4B, the non-volatile memory of the embodiment according to the present invention is for example disposed on an SOI substrate 200. The SOI substrate 200 for example is composed of a substrate material layer 202, a dielectric layer 204, and a first conductive type silicon body layer 206. The dielectric layer 204 for example is made of oxide.

In the first conductive type silicon body layer 206, there is disposed an isolation structure 208 defining a device active area 210. The isolation structure 208 for example is a shallow trench isolation (STI) structure. The STI structure for example is made of silicon oxide. As an alternative option, the isolation structure 208 can also be a field oxidation layer.

The non-volatile memory for example is composed of a memory cell 212 and a selecting transistor 214 serially connected thereto.

The memory cell 212 for example is disposed on the SOI substrate 200. The memory cell 212 for example includes a gate 222, a bottom dielectric layer 216, a charge storage structure 218, a top dielectric layer 220, a second conductive type source/drain region 228, and a second conductive type source/drain region 230.

The gate 222 for example is disposed on the SOI substrate 200. The gate 222 for example is made of doped polysilicon.

The charge storage structure 218 for example is disposed between the gate 222 and the SOI substrate 200. The charge storage structure 218 for example can be made of silicon nitride or nanocrystal. However, the charge storage structure 218 is not limited to be made of silicon nitride or nanocrystal. It can also be made of other materials, such as silicon oxynitride, tantalum oxide, strontium titanate, hafnium oxide, etc.

The bottom dielectric layer 216 for example is disposed between the charge storage structure 218 and the SOI substrate 200. The bottom dielectric layer 216 for example is made of silicon oxide.

The top dielectric layer 220 for example is disposed between the charge storage structure 218 and the gate 222. The top dielectric layer 220 for example is made of silicon oxide or other dielectric material having a high dielectric constant.

The second conductive type source/drain region 228 and the second conductive type source/drain region 230 for example are distributed in the first conductive type silicon body layer 206 and at two sides of the gate 222.

The selecting transistor 214 for example is disposed on the SOI substrate 200. The selecting transistor 214 for example includes a gate 226, a gate dielectric layer 224, a second conductive type source/drain region 230, and a second conductive type source/drain region 232.

The gate 226 is disposed on SOI substrate 200. The gate 226 for example is made of doped polysilicon.

The gate dielectric layer 224 for example is disposed between the gate 226 and the SOI substrate 200. The gate dielectric layer for example is made of silicon oxide.

The second conductive type source/drain region 230, the second conductive type source/drain region 232 for example are disposed in the first conductive type silicon body layer 206 at two sides of the gate 226. The selecting transistor 214 and the memory cell 212 share the second conductive type source/drain region 230 in common.

Further, there are a plug 234 and a conductive line 236 (bit line) disposed on the second conductive type source/drain region 228. The conductive line 236 is electrically connected to the second conductive type source/drain region 228 via the plug 234. The plug 234 and the conductive line 236 are made of metallic materials, or doped polysilicon. There are also a plug 238 and a conductive line 240 (source line) disposed on the second conductive type source/drain region 232. The conductive line 240 is electrically connected to the second conductive type source/drain region 232 via the plug 238. The plug 238 and the conductive line 240 are made of metallic materials, or doped polysilicon.

In the foregoing embodiments, if the first conductive type is P type, and the second conductive type is N type, then the memory cell 212 is an N type channel memory cell, and the selecting transistor 214 is an N type channel transistor; and if the first conductive type is N type, and the second conductive type is P type, then the memory cell 212 is a P type channel memory cell, and the selecting transistor 214 is a P type channel transistor. According to the present embodiment, the memory cell 212 is exemplified as a partial depletion transistor. However, the non-volatile memory according to the present invention can also be a full depletion memory cell and the selecting transistor 214 can also be a full depletion transistor as shown in FIG. 4C.

Figure 5:
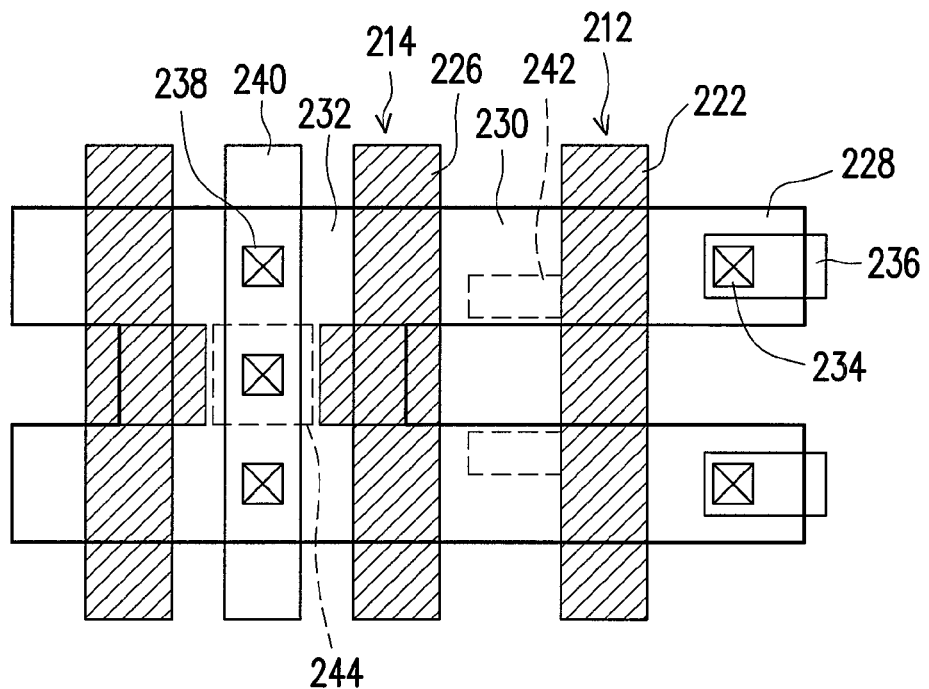
FIG. 5 is a top view of a non-volatile memory according to an embodiment of the present invention.

FIG. 5 is a top view of a non-volatile memory according to an embodiment of the present invention. In FIG. 5, the elements described therein are similarly marked as shown in FIG. 4A, and the descriptions corresponding to similar elements are omitted, while only differences there between are discussed in detail here below.

As shown in FIG. 5, the memory according to the present invention further includes a first conductive type doped region 242 and a first conductive type doped region 244. The first conductive type doped region 242 for example is disposed in the first conductive type silicon body layer 206, and is electrically connected to the first conductive type silicon body layer 206 beneath the gate 222. The first conductive type doped region 242 is disposed at one side of the gate 222, and is neighbours on the second conductive type second source/drain region 230. The first conductive type doped region 244 for example is disposed in the first conductive type silicon body layer 206, and is electrically connected to the first conductive type silicon body layer 206 beneath the gate 226. The first conductive type doped region 244 is disposed at one side of the gate 226, and neighbours on the second conductive type source/drain region 232.

Figure 6:
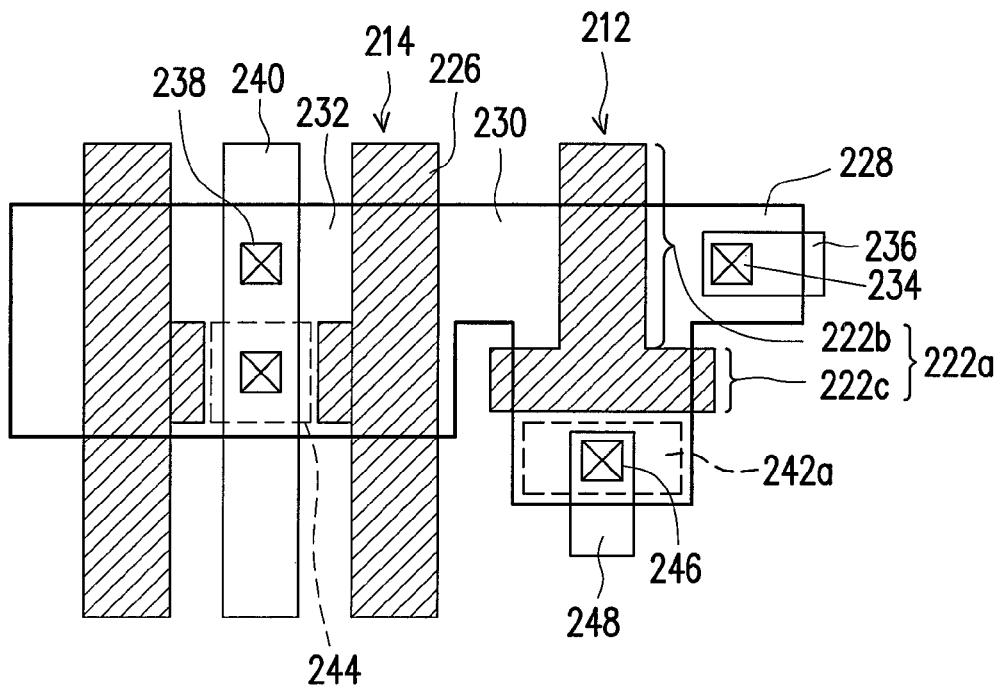
FIG. 6 is a top view of a non-volatile memory according to another embodiment of the present invention.

FIG. 6 is a top view of a non-volatile memory according to another embodiment of the present invention. In FIG. 6, the elements described therein are similarly marked as shown in FIG. 5, and the descriptions corresponding to similar elements are omitted, while only differences there between are discussed in detail here below.

As shown in FIG. 6, a gate 222a of the memory cell 212 for example is composed of a first portion 222b and a second portion 222c. The second portion 222c for example is configured at an end of the first portion 222b. The first portion 222b and the second portion 222c are substantially perpendicular one to another. As such, as shown in FIG. 6, the gate 222a is substantially configured with a T shape.

The second conductive type source/drain region 228, the second conductive type source/drain region 230 for example are disposed in the first conductive type silicon body layer 206 at two sides of the first portion 222b.

The first conductive type doped region 242a for example is disposed in the first conductive type silicon layer 206 at one side of the second portion 222c, and is interspaced by the second portion 222c to be opposite to the second conductive type source/drain region 228 and the second conductive type source/drain region 230.

Further, there are disposed a plug 246 and a conductive line 248 on the first conductive type doped region 242a. The conductive line 248 electrically connected to the first conductive type doped region 242a via the plug 246. The plug 246 and the conductive line 248 can be made of for example metallic materials, or doped polysilicon.

In a memory cell according to the present invention, because of the disposition of the first conductive type doped region 242 (242a) and 244 that are electrically coupled to the first conductive type silicon body layer 206 beneath the gate 222 (222a) and the gate 226, when operating the memory cell 212, a voltage can be applied to the first conductive type silicon body layer 206 beneath the gate 222 (222a) and the gate 226, when operating the memory cell 212. In such a way, a voltage of the first conductive type silicon body layer 206 beneath the gate 222 (222a) and the gate 226 is prevented from deviating from an originally determined value thereof due to the accumulation of the hot carriers in the silicon body layer 206. In such a way, a threshold voltage of the memory cell 212 can be maintained and thus improving the operation efficiency thereof.

FIGS. 7A-7E schematically illustrate an operation process of an N type non-volatile memory according to the present invention.

Figure 7A:
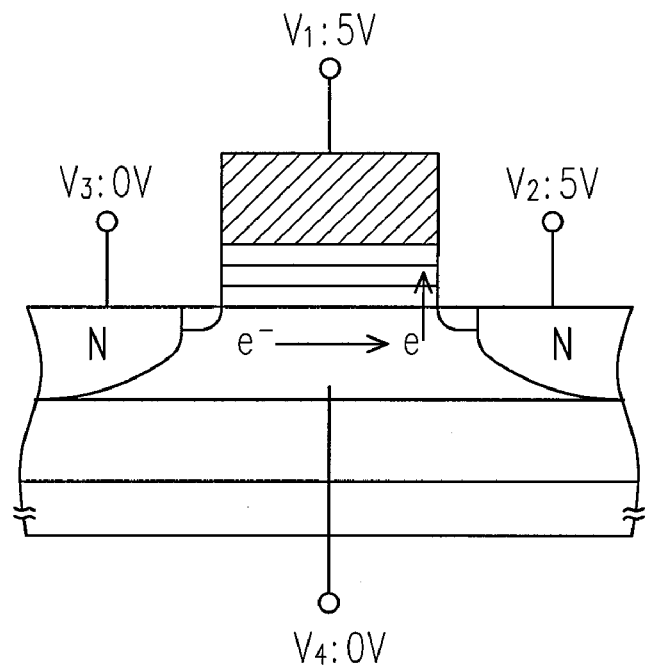
FIGS. 7A-7E schematically illustrate an operation process of an N type non-volatile memory according to the present invention.

As shown in FIG. 7A, a voltage V1 is applied to the gate; a voltage V2 is applied to the drain region; a voltage V3 is applied to the source region; and a voltage V4 is applied to the silicon body layer beneath the gate, in which V2>V3, and V1>V4, so as to inject hot electrons into the charge storage structure with a channel hot electron injection. Specifically, the voltage V1 is for example about 5 volts; the voltage V2 is for example about 5 volts; the voltage V3 is for example about 0 volts, and the voltage V4 is for example about 0 volts.

Figure 7B:
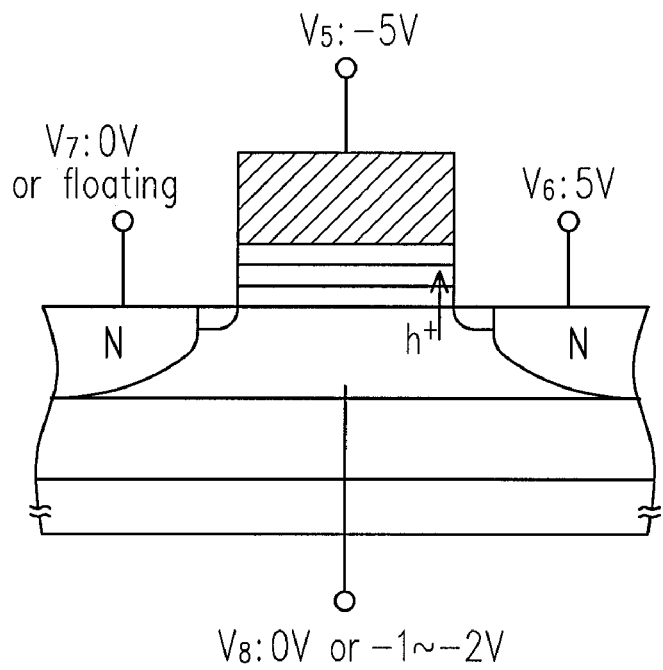

As shown in FIG. 7B, a voltage V5 is applied to the gate; a voltage V6 is applied to the drain region; a voltage V7 is applied to the source region; and a voltage V8 is applied to the silicon body layer beneath the gate, in which V6>V5, and V8>V5, so as to inject holes into the charge storage structure by band-to-band tunnelling hot hole injection. Specifically, the voltage V5 is for example about −5 volts; the voltage V6 is for example about 5 volts; the voltage V7 is for example about 0 volt or floating, and the voltage V8 is for example 0 volt or about −1 to −2 volts.

Figure 7C:
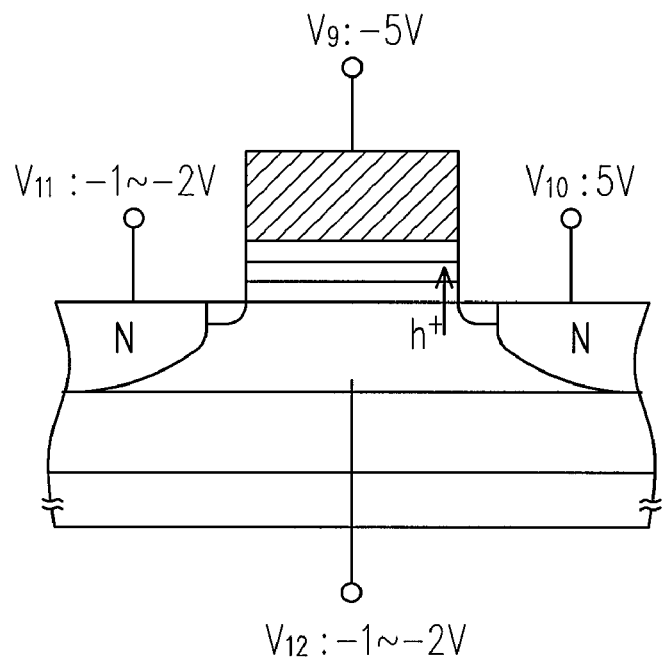

As shown in FIG. 7C, a voltage V9 is applied to the gate; a voltage V10 is applied to the drain region; a voltage V11 is applied to the source region; and a voltage V12 is applied to the silicon body layer beneath the gate, in which V10>V11, and V12>V9, so as to inject holes into the charge storage structure by band-to-band tunnelling hot hole injection. Specifically, the voltage V9 is for example about −5 volts; the voltage V10 is for example about 5 volts; the voltage V11 is for example about −1 to −2 volts, and the voltage V12 is for example about −1 to −2 volts.

Figure 7D:
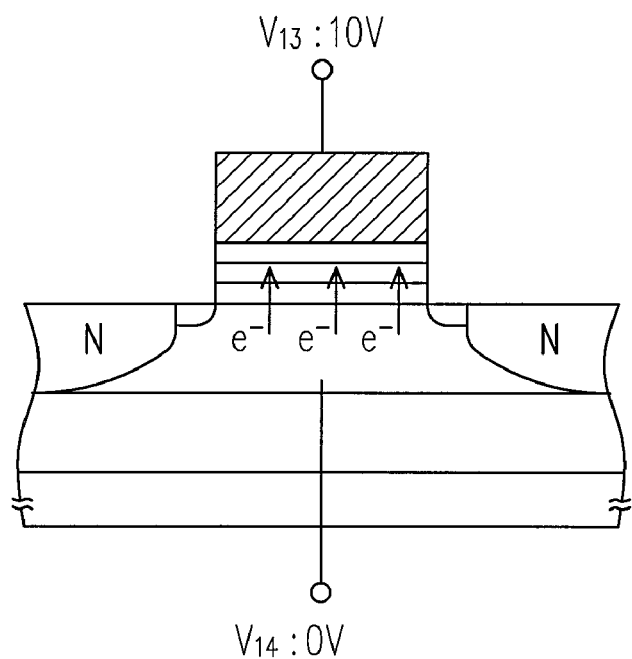

As shown in FIG. 7D, a voltage V13 is applied to the gate; a voltage V14 is applied to the silicon body layer beneath the gate so as to inject electrons into the charge storage structure by F-N tunnelling. Specifically, there requires a voltage difference between the voltages V13 and V14 for triggering the F-N tunnelling. The voltage difference is preferred to be about 10 volts. For example, the voltage V13 can be about 10 volts, and the voltage V14 can be about 0 volt. Of course, the voltage V13 can be about 5 volts, and the voltage V14 can be about −5 volts.

Figure 7E:
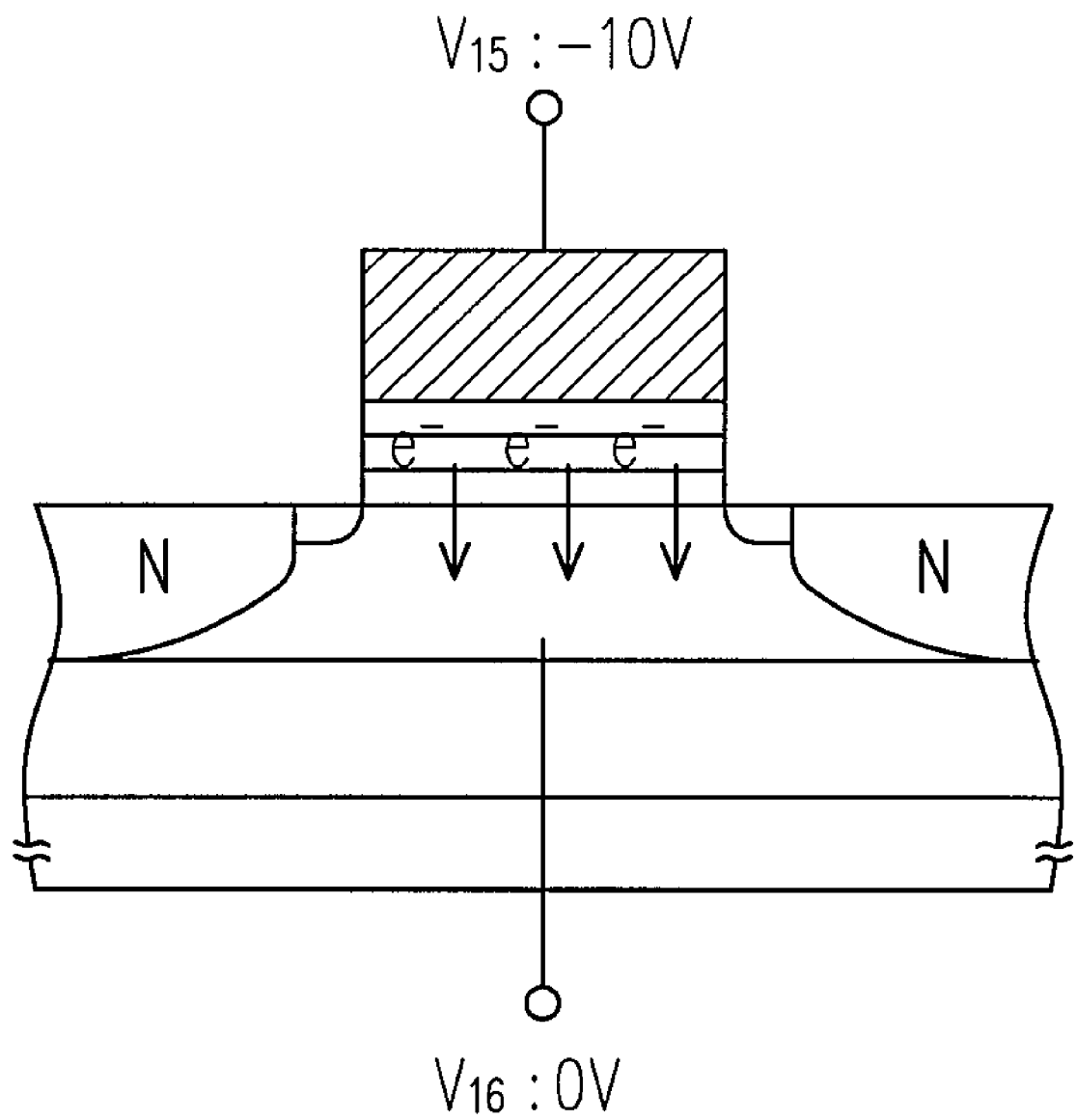

As shown in FIG. 7E, a voltage V15 is applied to the gate; a voltage V16 is applied to the silicon body layer beneath the gate so as to evacuate electrons from the charge storage structure by F-N tunnelling. Specifically, there requires a voltage difference between the voltages 13 and 14 for triggering the F-N tunnelling. The voltage difference is preferred to be about −10 volts. For example, the voltage V15 can be about −10 volts, and the voltage V16 can be about 0 volt. Of course, the voltage V15 can be about −5 volts, and the voltage V16 can be about 5 volts.

As shown in FIGS. 7A to 7E, the operation of inject electrons into the charge storage structure for example is defined as a programming operation process, and the operation of inject holes in to the charge storage structure or evacuating electrons from the charge storage structure are defined as an erasing operation process.

FIGS. 8A-8D schematically illustrate an operation process of a P type non-volatile memory according to the present invention.

Figure 8A:
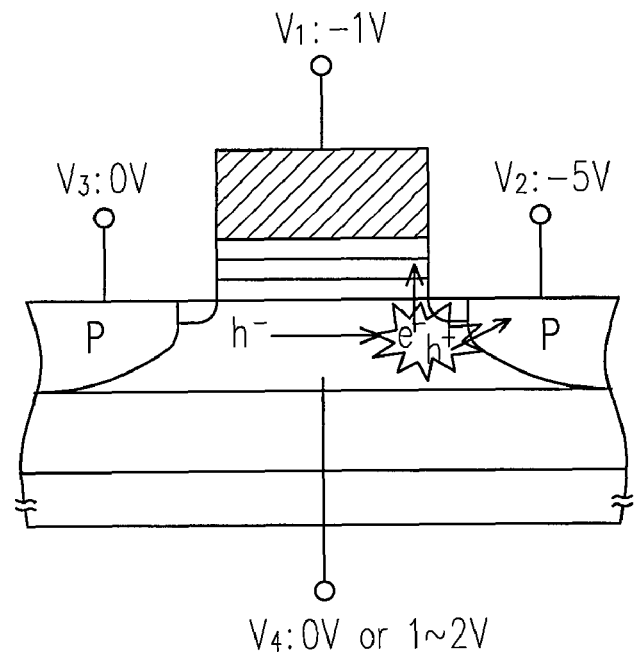
FIGS. 8A-8C schematically illustrate an operation process of a P type non-volatile memory according to the present invention.

As shown in FIG. 8A, a voltage V1 is applied to the gate; a voltage V2 is applied to the drain region; a voltage V3 is applied to the source region; a voltage V4 is applied to the silicon body layer beneath the gate, in which V3>V2, and V4>V1. When the P type non-volatile memory is operated, the P type channel is conducted with holes. After obtaining enough energy, the holes cause ion impact at the drain side so as to generate electron-hole pairs. Some electrons of the electron-hole pairs having enough energy and changed moving direction to move toward the gate, and are then injected into and stored in the charge storage structure. Specifically, in this embodiment, the voltage V1 is preferred about −1 volt;

the voltage V2 is preferred about −5 volts; the voltage V3 is preferred about 0 volt; and the voltage V4 is preferred about 0 volt or about 1 to 2 volts.

Figure 8B:
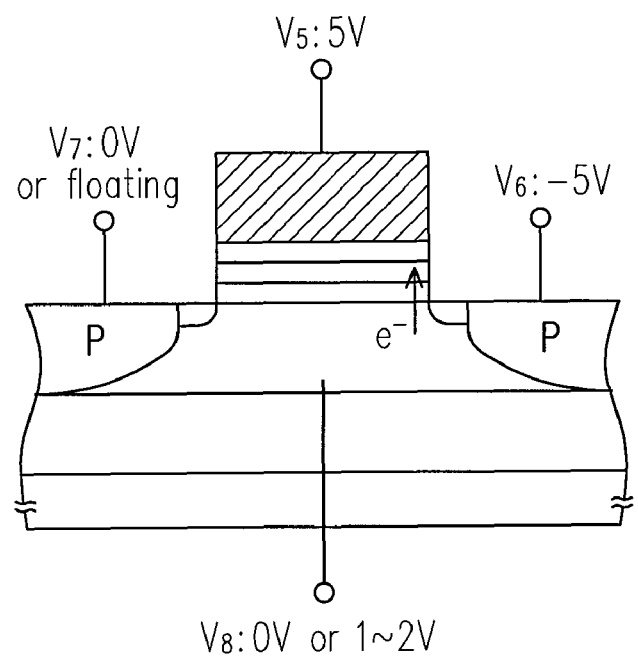

As shown in FIG. 8B, a voltage V5 is applied to the gate; a voltage V6 is applied to the drain region; a voltage V7 is applied to the source region; a voltage V8 applied to the silicon body layer beneath the gate, in which V5>V6, and V5>V8. Electrons are injected into the charge storage structure by band-to-band tunnelling hot electron injection. Specifically, in this embodiment, the voltage V5 is preferred about 5 volts; the voltage V6 is preferred about −5 volts; the voltage V7 is preferred about 0 volt or is floating; and the voltage V8 is preferred about 0 volt or about 1 to 2 volts.

Figure 8C:
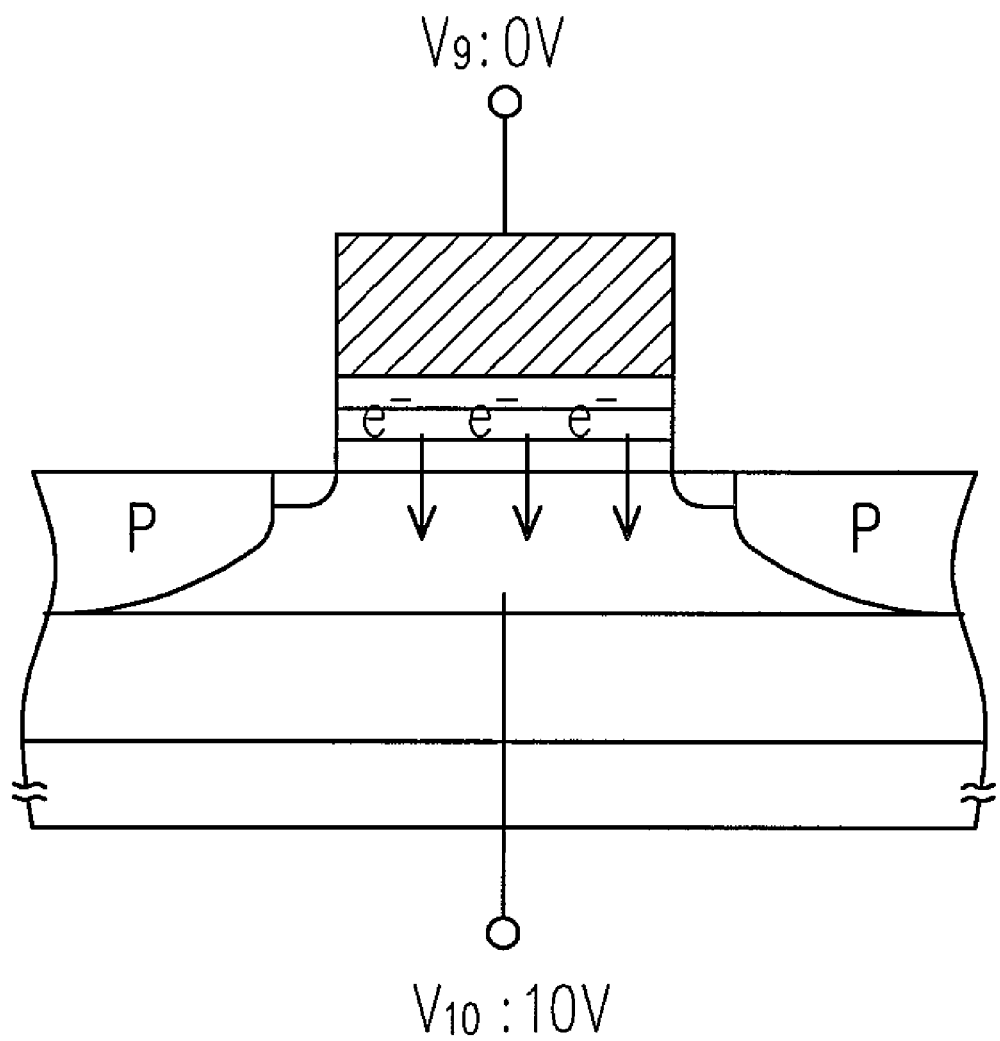

Referring to FIG. 8C, a voltage V9 is applied to the gate; a voltage V10 is applied to the silicon body layer beneath the gate so as to evacuate electrons from the charge storage structure by F-N tunnelling. Specifically, there requires a voltage difference between the voltages V9 and V10 for triggering the F-N tunnelling. The voltage difference is preferred to be about −10 volts. For example, the voltage V9 can be about 0 volt, and the voltage V10 can be about 10 volts. Of course, the voltage V9 can be about −5 volts, and the voltage V10 can be about 5 volts.

As shown in FIGS. 8A to 8C, the operation of inject electrons into the charge storage structure for example is defined as a programming operation process, and the operation of evacuating electrons from the charge storage structure are defined as an erasing operation process.

Figure 9A:
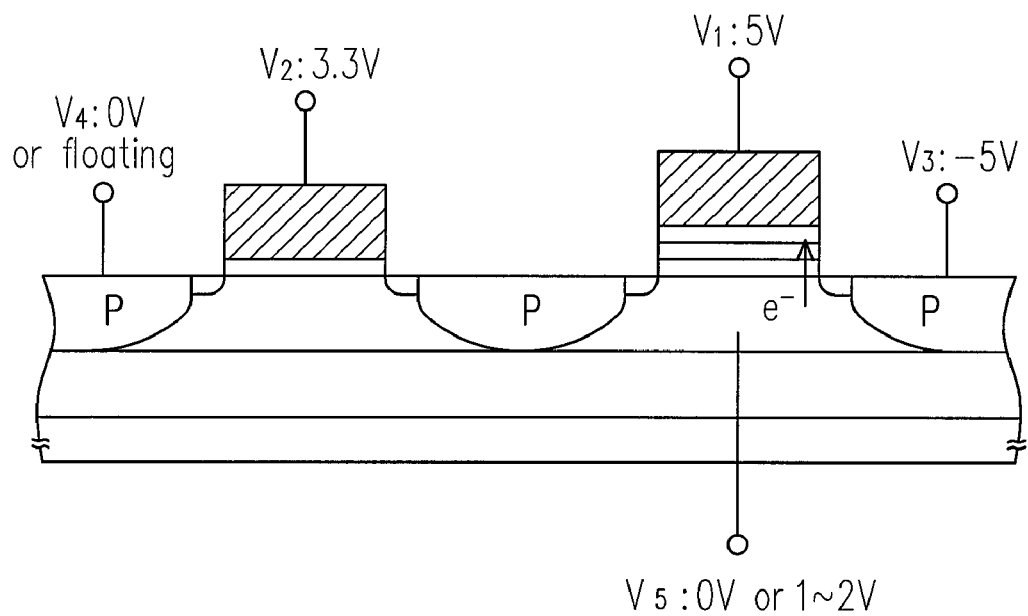
FIGS. 9A-9C illustrate an operation process of a P type non-volatile memory including a memory cell and a selecting transistor.
Figure 9B:
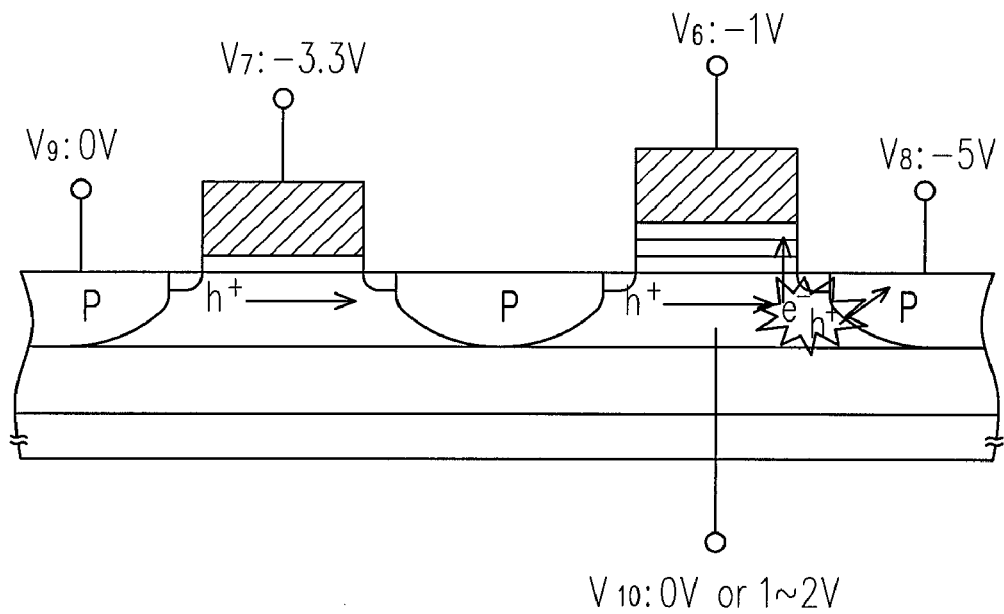
Figure 9C:
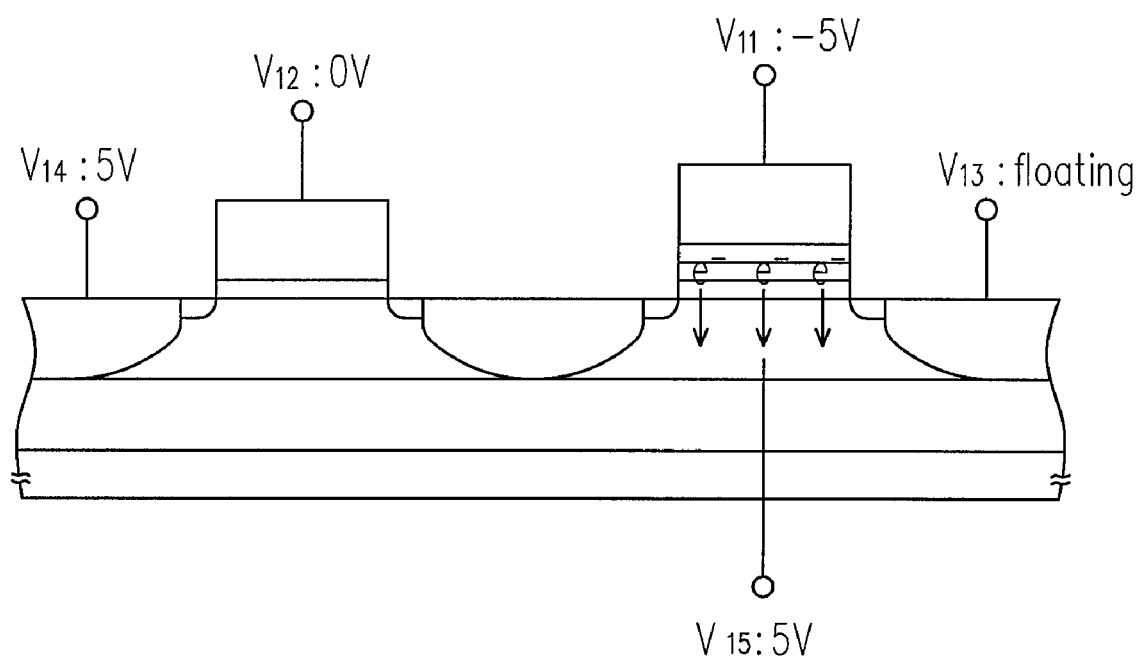

FIGS. 9A-9C illustrate an operation process of a P type non-volatile memory including a memory cell and a selecting transistor.

Referring to FIGS. 9A-9C, the non-volatile memory is disposed on an SOI substrate having a silicon body layer. The non-volatile memory includes a memory cell and a selecting transistor serially connected to the memory cell. The memory cell includes a first gate, a charge storage structure, a first source/drain region and a second source/drain region. The selecting transistor includes a second gate, a second source/drain region, and a third source/drain region. The second source/drain region is shared in common by the selecting transistor and the memory cell.

As shown in FIG. 9A, in programming the memory cell, a voltage V1 is applied to the first gate; a voltage V2 is applied to the second gate; a voltage V3 is applied to the first source/drain region; a voltage V4 is applied to the third source/drain region; and a voltage V5 is applied to the silicon body layer beneath the first gate, in which the voltage V2 is enough to turn off a channel of the selecting transistor; V1>V3; V1>V5. Electrons are injected into the charge storage structure by band-to-band tunnelling hot electron injection. Specifically, in this embodiment, the voltage V1 is preferred about 5 volts; the voltage V2 is preferred about 3.3 volts; the voltage V3 is preferred about −5 volts; the voltage V4 is preferred about 0 volt or floating; and the voltage V5 is preferred about 0 volt or about 1 to 2 volts.

As shown in FIG. 9B, in programming the memory cell, a voltage V6 is applied to the first gate; a voltage V7 is applied to the second gate; a voltage V8 is applied to the first source/drain region; a voltage V9 is applied to the third source/drain region; and a voltage V10 is applied to the silicon body layer beneath the first gate, in which the voltage V7 is enough to turn on the channel of the selecting transistor; V9>V8; and V10>V6. Under such a condition, the memory cell is slightly conductive. Because the P type channel is conducted with holes, after obtaining enough energy, the holes cause ion impact at the drain side so as to generate electron-hole pairs. Some electrons of the electron-hole pairs having enough energy and changed moving direction to move toward the gate, and are then injected into and stored in the charge storage structure. Specifically, in this embodiment, the voltage V6 is preferred about −1 volt; the voltage V7 is preferred about −3.3 volts; the voltage V8 is preferred about −5 volts; the voltage V9 is preferred about 0 volt or floating; and the voltage V10 is preferred about 0 volt or about 1 to 2 volts.

As shown in FIG. 9C, in erasing the memory cell, a voltage V11 is applied to the first gate; a voltage V12 is applied to the second gate; a voltage V13 is applied to the first source/drain region; a voltage V14 is applied to the third source/drain region; and a voltage V15 is applied to the silicon body layer beneath the first gate, in which the voltage V12 is enough to turn on the channel of the selecting transistor; and a voltage difference between the voltages V11 and V15 is enough for triggering an F-N tunnelling effect to evacuate electrons from the charge storage structure for achieving the erasing operation. Specifically, in this embodiment, the voltage V11 is preferred about −5 volt; the voltage V12 is preferred about 0 volt; the voltage V13 is preferred to be floating; the voltage V14 is preferred about 5 volts; and the voltage V15 is preferred about 5 volts.

In summary, according to the operating method for the non-volatile memory of the present invention, one selected from the group consisting of channel hot carrier injection, band-to-band tunnelling hot carrier injection, and F-N tunnelling is employed for inject electrons or holes into the charge storage structure, or evacuating electrons or holes from the charge storage structure, so as to program or erase the memory cell.

Furthermore, there is disposed a doped region, i.e., well pickup region, in the memory cell. A conductive type of the doped region is identical with that of the silicon body layer beneath the gate of the memory cell and/or the gate of the selecting transistor. As such, in operating the non-volatile memory, voltages are applied to the silicon body layer beneath the gate of the memory cell and/or the gate of the electing transistor, so as to avoid the voltage of the first conductive type silicon body layer from deviating from a predetermined value due to accumulation of hot carriers in the silicon body layer. In such a way, the threshold voltage of the memory cell can be maintained and thus improving the operation efficiency thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A non-volatile memory, comprising:
 a silicon on insulation (SOI) substrate, comprising a first conductive type silicon body layer;
 a memory cell, disposed on the SOT substrate, the memory cell comprising:
  a first gate, disposed on the SOT substrate, the first gate comprising:
   a first portion; and
   a second portion, disposed at an end of the first portion, and the first portion being substantially perpendicular and connecting with the second portion;
  a charge storage structure, disposed between the first gate and the SOI substrate;
  a bottom dielectric layer, disposed between the charge storage structure and the SOI substrate; and a second conductive type first source/drain region and a second conductive type second source/drain region disposed in the first conductive type silicon body layer at two sides of the first portion;

a selecting transistor, disposed on the SOI substrate, the selecting transistor comprising:

a second gate, disposed on the SOI substrate;

a gate dielectric layer, disposed between the second gate and the SOI substrate; and the second conductive type second source/drain region, disposed in the first conductive type silicon body layer at one side of the second gate, wherein the selecting transistor and the memory cell share the second conductive type second source/drain region in common; and a second conductive type third source/drain region disposed in the first conductive type silicon body layer at another side of the second gate; and a first conductive type first doped region disposed in the first conductive type silicon body layer at one side of the second portion, and interspaced by the second portion to be opposite to the second conductive type first source/drain region and the second conductive type second source/drain region.

2. The non-volatile memory according to claim 1, further comprising a first plug, electrically coupled to the first conductive type first doped region.

3. The non-volatile memory according to claim 1, further comprising a first conductive type second doped region disposed in the first conductive type silicon body layer and electrically connected to the first conductive type silicon body layer beneath the second gate.

4. The non-volatile memory according to claim 3, wherein the first conductive type second doped region is disposed at one side of the second gate, and neighbours on the second type third source/drain region.

5. The non-volatile memory according to claim 3, further comprising a second plug electrically connected to the first conductive type second doped region.

6. The non-volatile memory according to claim 1, further comprises:

a top dielectric layer, disposed between the charge storage structure and the first gate.

7. The non-volatile memory according to claim 1, wherein the memory cell is a full depletion memory cell, and the selecting transistor is a full depletion MOS transistor.

8. The non-volatile memory according to claim 1, wherein the memory cell is a partial depletion memory cell, and the selecting transistor is a partial depletion MOS transistor.

9. The non-volatile memory according to claim 1, wherein the charge storage structure is made of silicon nitride or nanocrystal.

* * * * *